(12) United States Patent
Zhang et al.

(10) Patent No.: US 12,347,687 B2
(45) Date of Patent: Jul. 1, 2025

(54) ETCH RATE MODULATION OF FinFET THROUGH HIGH-TEMPERATURE ION IMPLANTATION

(71) Applicant: Applied Materials, Inc., Santa Clara, CA (US)

(72) Inventors: Qintao Zhang, Mt Kisco, NY (US); Rajesh Prasad, Lexington, MA (US); Jun-Feng Lu, Shanghai (CN)

(73) Assignee: Applied Materials, Inc., Santa Clara, CA (US)

(*) Notice: Subject to any disclaimer, the term of this patent is extended or adjusted under 35 U.S.C. 154(b) by 326 days.

(21) Appl. No.: 18/013,675

(22) PCT Filed: Aug. 21, 2020

(86) PCT No.: PCT/CN2020/110530
§ 371 (c)(1),
(2) Date: Dec. 29, 2022

(87) PCT Pub. No.: WO2022/036695
PCT Pub. Date: Feb. 24, 2022

(65) Prior Publication Data
US 2023/0369050 A1    Nov. 16, 2023

(51) Int. Cl.
*H01L 21/265* (2006.01)
*H01L 21/311* (2006.01)

(52) U.S. Cl.
CPC ...... *H01L 21/265* (2013.01); *H01L 21/31116* (2013.01)

(58) Field of Classification Search
None
See application file for complete search history.

(56) References Cited

U.S. PATENT DOCUMENTS

| | | | |
|---|---|---|---|
| 8,664,060 | B2 | 3/2014 | Liu et al. |
| 9,276,013 | B1* | 3/2016 | Doris ............... H10D 64/015 |
| 10,332,748 | B2 | 6/2019 | Prasad et al. |
| 2005/0258477 | A1 | 11/2005 | Saito |
| 2016/0079428 | A1* | 3/2016 | Zhao ............... H10D 62/292 |
| | | | 438/150 |
| 2017/0005112 | A1* | 1/2017 | Chang ............ H01L 21/02255 |

(Continued)

FOREIGN PATENT DOCUMENTS

| | | |
|---|---|---|
| CN | 104064469 A | 9/2014 |
| CN | 104269376 A | 1/2015 |

(Continued)

OTHER PUBLICATIONS

International Search Report and Written Opinion dated May 25, 2021, for the International Patent Application No. PCT/CN2020/110530, filed on Aug. 21, 2020, 9 pages.

*Primary Examiner* — Roberts P Culbert
(74) *Attorney, Agent, or Firm* — KDW Firm, PLLC (57) ABSTRACT

A method of forming a semiconductor device may include forming a plurality of fins extending from a buried oxide layer, wherein a masking layer is disposed atop each of the plurality of fins, and performing a high-temperature ion implant to the semiconductor device. The method may further include performing an etch process to remove the masking layer from atop each of the plurality of fins, wherein the etch process does not remove the buried oxide layer.

19 Claims, 5 Drawing Sheets

(56) References Cited

U.S. PATENT DOCUMENTS

2018/0151387 A1* 5/2018 Liu .................... H10D 30/6212
2021/0091208 A1* 3/2021 Song .................. H10D 30/6757

FOREIGN PATENT DOCUMENTS

| CN | 105810643 A | 7/2016 |
| CN | 108231594 A | 6/2018 |
| CN | 110634942 A | 12/2019 |

* cited by examiner

ETCH RATE MODULATION OF FinFET THROUGH HIGH-TEMPERATURE ION IMPLANTATION

FIELD OF THE DISCLOSURE

The present disclosure relates to semiconductor devices, and more particularly, to devices and methods of etch rate modulation of finFETs through high-temperature ion implantation.

BACKGROUND OF THE DISCLOSURE

A FinFET is a field effect transistor including a narrow, active area of a semiconductor material protruding from a substrate so as to resemble a fin. The fin includes source and drain regions. Active areas of the fin are separated by shallow trench isolation (STI), such as $SiO_2$. The FinFET also includes a gate region located between the source and the drain regions. The gate region is formed on a top surface and sidewalls of the fin so the gate region wraps around the fin. The portion of the fin extending under the gate between the source region and the drain region is the channel region.

One type of FinFET is fabricated with silicon on insulator (SOI) wafers. SOI FinFETs generally provide lower leakage current from source to drain due to the oxide layer below the fin, which blocks the leakage current. However, one yield challenge is the lack of etch selectivity between dummy oxide and the box layer of the device stack. It is often seen that during removal of the dummy oxide, the box layer underneath the spacer may be etched away, thus causing a S/D to channel short or low breakdown voltage.

Therefore, there is a need for improved methods of forming finFET devices.

SUMMARY OF THE DISCLOSURE

In one approach, a method may include providing a semiconductor device within a process chamber, the semiconductor device including a plurality of fins extending from a buried oxide layer, and a masking layer atop each of the plurality of fins. The method may further include performing a high-temperature ion implant to the semiconductor device, and performing an etch process to remove the masking layer from atop each of the plurality of fins, without removing the buried oxide layer.

In another approach, a masking layer removal process may include providing a semiconductor device including a plurality of fins extending vertically from a thermally grown oxide layer and a masking layer atop each of the plurality of fins. The method may further include performing a high-temperature ion implant to the semiconductor device, and performing an etch process to remove the masking layer from atop each of the plurality of fins, wherein the etch process does not remove the thermally grown oxide layer.

In yet another approach, a method of forming a semiconductor device may include forming a plurality of fins extending from a buried oxide layer, wherein a masking layer is disposed atop each of the plurality of fins, performing a high-temperature ion implant to the semiconductor device, and performing an etch process to remove the masking layer from atop each of the plurality of fins, wherein the etch process does not remove the buried oxide layer.

BRIEF DESCRIPTION OF THE DRAWINGS

By way of example, embodiments of the disclosure will now be described, with reference to the accompanying drawings, in which.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods and devices in accordance with the present disclosure will now be described more fully hereinafter with reference to the accompanying drawings, where embodiments of the methods are shown. The methods and devices may be embodied in many different forms and are not to be construed as being limited to the embodiments set forth herein. Instead, these embodiments are provided so the disclosure will be thorough and complete, and will fully convey the scope of the system and method to those skilled in the art.

As described above, semiconductor fabrication comprises many discrete processes to create the desired features or devices. Some of these processes include lithography, etching, deposition and ion implantation. Often, in the case of etching, a material, also referred to as a mask or hard mask, is disposed on the surface to be etched. Portions of the hard mask are removed, creating openings that expose some material or the underlying workpiece. The opening in the hard mask after this process is referred to as the critical dimension (CD). There is an inherent CD variation across several similar structures, both within a die and across the workpiece. CD variability impacts circuit performance and reduction of this variability is beneficial. The exposed material or underlying workpiece is then treated with an etching process, which removes the exposed material or underlying workpiece.

This etching process functions due to the difference in etch rate between the hard mask and etch rate of the underlying material or workpiece. In other words, the etching process of prior art approaches typically removes the material or underlying workpiece at a faster rate than it removes the hard mask. In this way, the exposed material or workpiece is etched, while the hard mask protects other portions of the workpiece.

However, it has been found that providing a relatively etch resistant hardmask over a buried oxide (BOX) layer of SOI finFETs results in undesirable removal of the BOX layer during an etch process, such as during removal of a dummy oxide over the BOX layer. Therefore, embodiments of the present disclosure advantageously provide approaches for modulating the etch resistance of the hard mask and other materials, such as the BOX layer, to allow currently used materials to continue to be exploited. Further, it would be beneficial if this method did not affect the overall throughput of the semiconductor fabrication process.

As will be described herein, embodiments of the present disclosure address the deficiencies of the prior art by providing a high temperature (e.g., Thermion 150 C-550 C) ion implant to a finned substrate, including a thermally grown BOX layer, to avoid Si ion implant damage to the BOX layer during a subsequent etch process. The high-temperature implant advantageously enables dynamic annealing.

Throughout this disclosure, the phrase "etch rate" is used to denote the rate at which material is removed by an etching process. The phrase "etch resistance" is used to denote a material's ability to withstand an etching process. Thus, an increase in etch resistance lowers the material's etch rate, while a decrease in etch resistance increases the material's etch rate.

Figure 1:
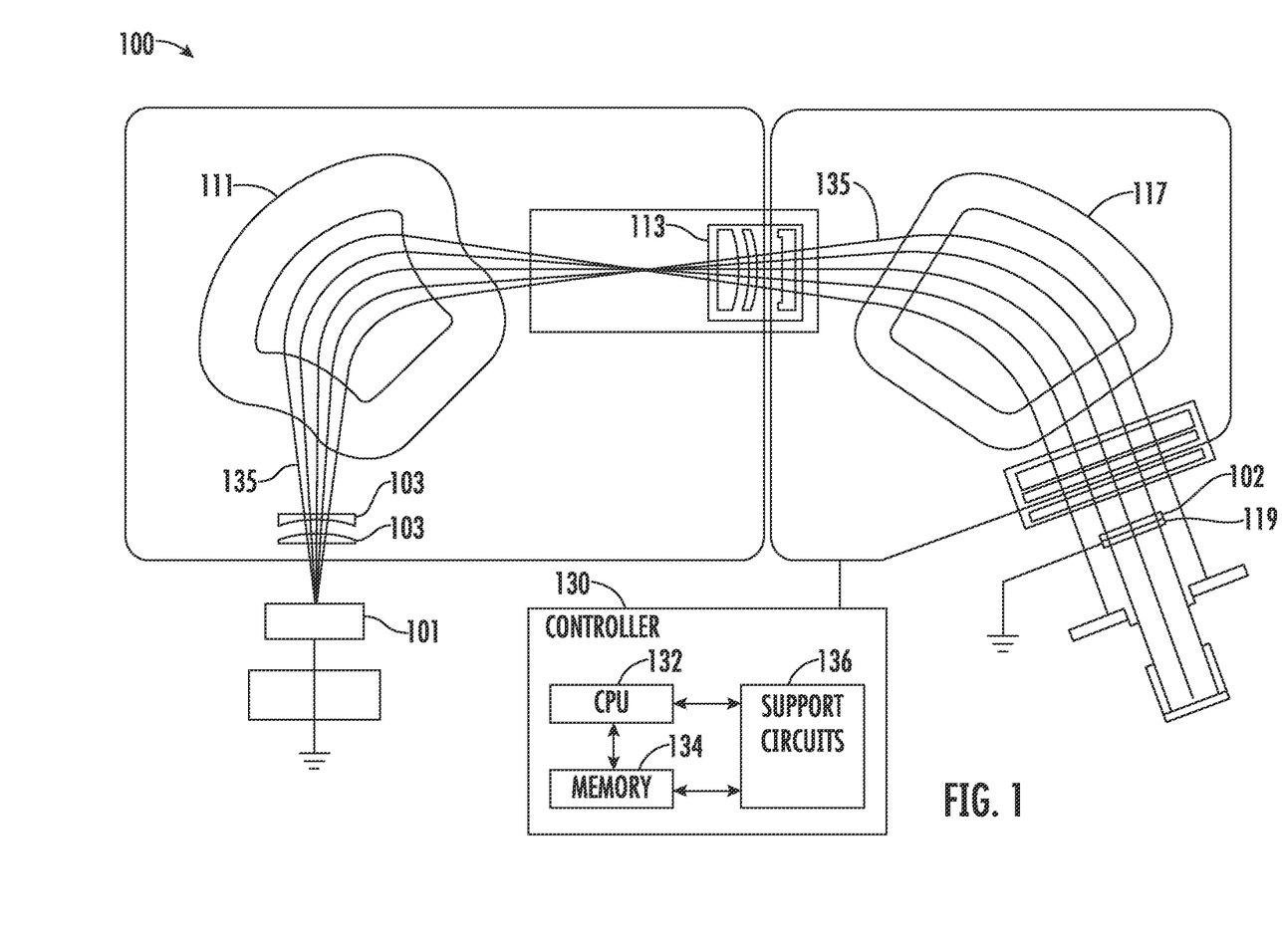
FIG. 1 is a schematic of a system for forming a semiconductor device according to embodiments of the present disclosure.

FIG. 1 illustrates a schematic diagram of a processing apparatus 100 useful to perform processes described herein. One example of a beam-line ion implantation processing apparatus is the Varian VIISTA® Trident, available from Applied Materials Inc., Santa Clara, CA. In other embodiments, the processing apparatus may be a variety of other ion implantation apparatuses, such as plasma immersion ion implantation apparatus or plasma assisted doping apparatus, which may be used to perform the methods described herein.

The processing apparatus 100 may include an ion source 101 for generating ions. The processing apparatus 100 may also include a series of beam-line components. Examples of beam-line components may include extraction electrodes 103, a magnetic mass analyzer 111, a plurality of lenses 113, and a beam parallelizer 117. The processing apparatus 100 may also include a platen 119 for supporting a substrate 102 to be processed. The substrate 102 may be moved in one or more dimensions (e.g. translate, rotate, tilt, etc.) by a component sometimes referred to as a "roplat" (not shown). It is also contemplated that the processing apparatus 100 may be configured to perform heated implantation processes to provide for improved control of implantation characteristics, such as the ion trajectory and implantation energy utilized to dope the substrate.

In operation, ions of the desired species, for example, dopant ions, are generated and extracted from the ion source 101. Thereafter, the extracted ions 135 travel in a beam-like state along the beam-line components and may be implanted in the substrate 102. Similar to a series of optical lenses that manipulate a light beam, the beam-line components manipulate the extracted ions 135 along the ion beam. In such a manner, the extracted ions 135 are manipulated by the beam-line components while the extracted ions 135 are directed toward the substrate 102. It is contemplated that the apparatus 100 may provide for improved mass selection to implant desired ions while reducing the probability of undesirable ions (impurities) being implanted in the substrate 102.

In some embodiments, the processing apparatus 100 can be controlled by a processor-based system controller such a controller 130. For example, the controller 130 may be configured to control beam-line components and processing parameters associated with beam-line ion implantation processes. The controller 130 may include a programmable central processing unit (CPU) 132 that is operable with a memory 134 and a mass storage device, an input control unit, and a display unit (not shown), such as power supplies, clocks, cache, input/output (I/O) circuits, and the like, coupled to the various components of the processing apparatus 100 to facilitate control of the substrate processing. The controller 130 also includes hardware for monitoring substrate processing through sensors in the processing apparatus 100, including sensors monitoring the substrate position and sensors configured to receive feedback from and control a heating apparatus coupled to the processing apparatus 100. Other sensors that measure system parameters such as substrate temperature and the like, may also provide information to the controller 130.

To facilitate control of the processing apparatus 100 described above, the CPU 132 may be one of any form of general-purpose computer processor that can be used in an industrial setting, such as a programmable logic controller (PLC), for controlling various chambers and sub-processors. The memory 134 is coupled to the CPU 132 and the memory 134 is non-transitory and may be one or more of readily available memory such as random access memory (RAM), read only memory (ROM), floppy disk drive, hard disk, or any other form of digital storage, local or remote. Support circuits 136 may be coupled to the CPU 132 for supporting the processor in a conventional manner. Implantation and other processes are generally stored in the memory 134, typically as a software routine. The software routine may also be stored and/or executed by a second CPU (not shown) that is remotely located from the hardware being controlled by the CPU 132.

The memory 134 is in the form of computer-readable storage media that contains instructions, that when executed by the CPU 132, facilitates the operation of the apparatus 100. The instructions in the memory 134 are in the form of a program product such as a program that implements the method of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

Figure 2:
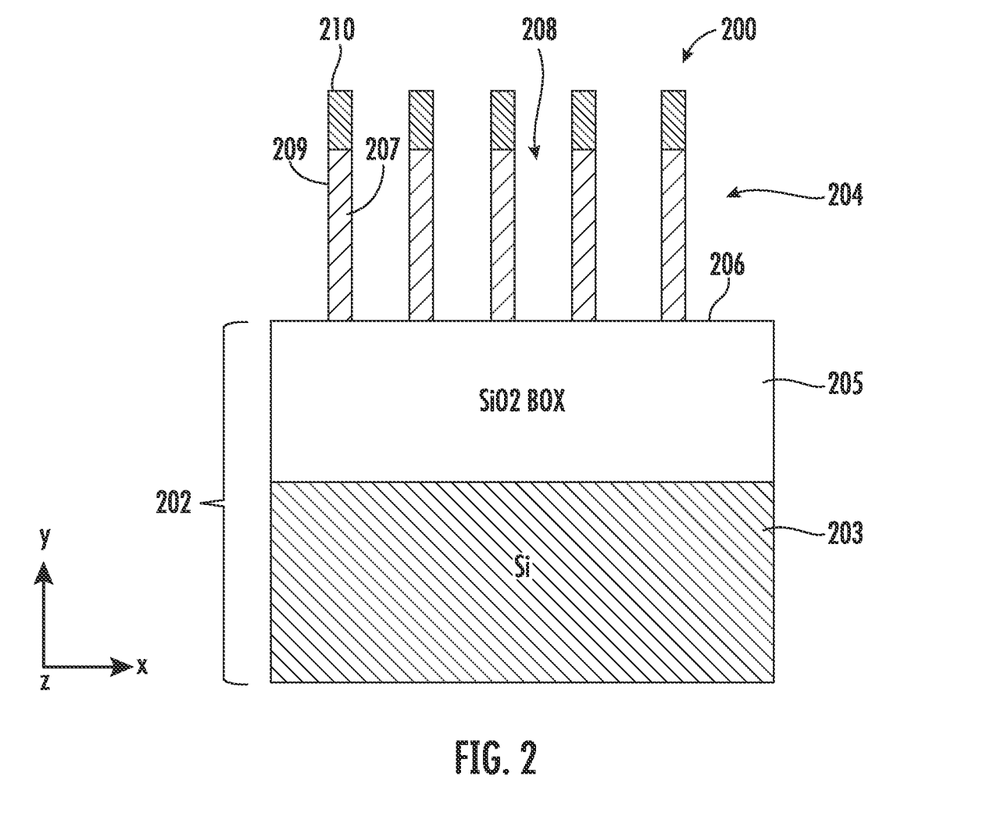
FIG. 2 is a side cross-sectional view of a finned device according to embodiments of the present disclosure.

FIG. 2 depicts a side cross-sectional view of a semiconductor device (hereinafter "device") 200 in accordance with embodiments of the present disclosure. The device 200 may include a substrate 202, which may be a silicon substrate layer 203 and a buried oxide (BOX) layer 205 atop the silicon substrate layer 203. In some embodiments, the BOX layer 205 is a thermally or epitaxially grown silicon oxide layer. As shown, the device 200 may include a plurality of fins 204 extending from the substrate 202. In some embodiments, each of the plurality of fins 204 extends approximately perpendicularly from a top surface 206 of the substrate 202. The plurality of fins 204 may constitute fin structures formed into fin-type field effect transistors (fin-FETs). Each of the plurality of fins 204 may include a first sidewall 209 parallel to a second sidewall 207. As shown, the plurality of fins 204 may include a masking layer 210, such as SiN hardmask, formed thereon.

The plurality of fins 204 may be semiconductor strips of Si formed in the substrate 202. In some embodiments, the plurality of fins 204 may be formed in the substrate 202 by etching a plurality of trenches 208 therein. The etching may be any suitable etch process, such as a reactive ion etch (RIE), neutral beam etch (NBE), the like, or a combination thereof. The etch may be anisotropic. Embodiments herein are not limited in this context, however.

As used herein, to provide spatial context, XYZ Cartesian coordinates are shown in figures. It is to be understood that the term "vertical" as used herein denotes a y-direction of the Cartesian coordinates shown in the figures, and that the terms "horizontal" or "lateral" as used herein denotes an x-direction of the Cartesian coordinates shown in the drawings, which is perpendicular to the y-direction.

Figure 3:
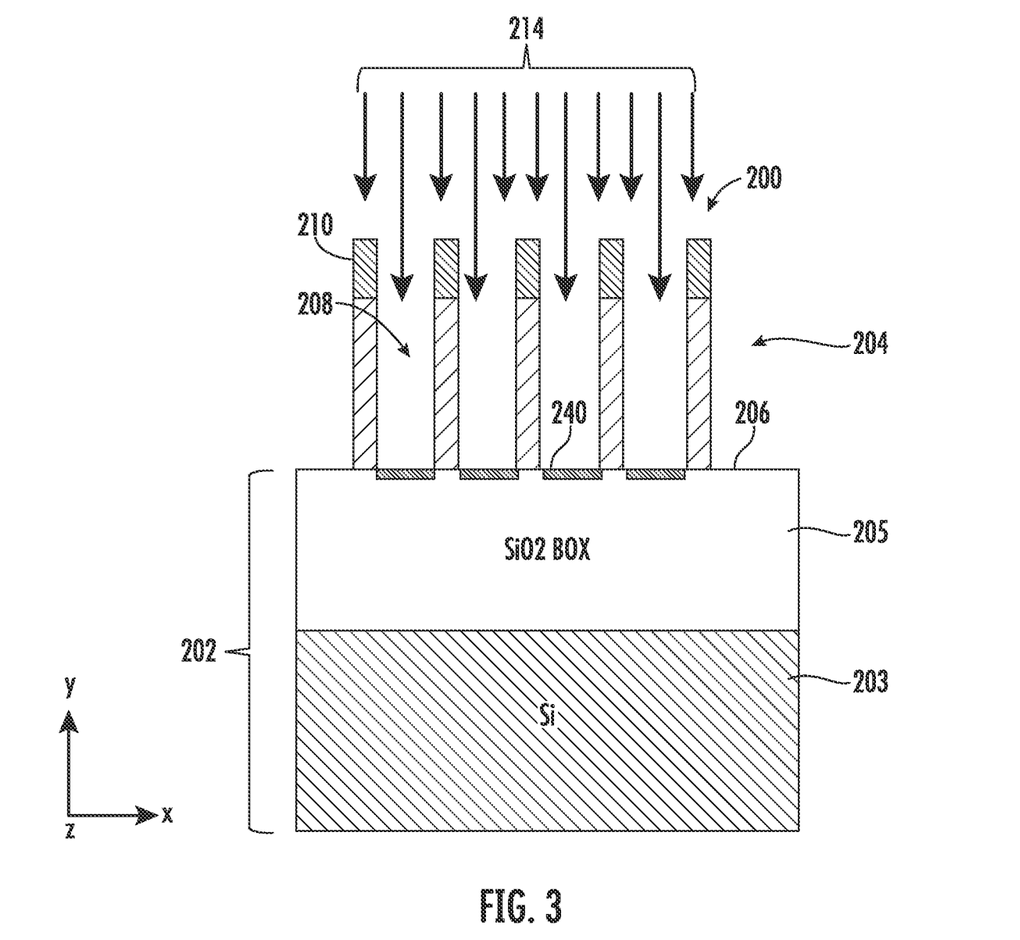
FIG. 3 is a side cross-sectional view of the device during an ion treatment according to embodiments of the present disclosure.

As shown in FIG. 3, the device 200 may receive an ion implant/ion assisted plasma treatment 214. The ion implant 214 may include an etch rate modifying species, such as Si, implanted into the BOX layer 205 after the plurality of trenches 208 is formed. The ion implant 214 may be vertical, as shown, or delivered at an angle. The etch rate modifying species may increase the difference between the etch rate of the masking layer 210 and the etch rate of the underlying material, such as the BOX layer 205, to help preserve the integrity of the BOX layer 205 during a subsequent etching process. In exemplary embodiments, the etch rate of the BOX layer 205 is decreased by the etch rate modifying species. Said differently, the ion implant 214 may impact the top surface 206 of the BOX layer 205 to create a hardened surface/layer 240. It will be appreciated that the thickness or depth (e.g., in the negative y-direction) of the hardened surface/layer 240 will depend upon a number of process parameters of the ion implant 214 including, but not limited to, type of ion species and implant dose/energy.

In exemplary embodiments, the ion implant 214 is a high-temperature (e.g., between 150° C. and 550° C.) Si ion implant, which modifies the etch resistance of the BOX layer 205 relative to other portions of the device 200, such as the masking layer 210. In one example, a heater (e.g., a beam line heater manufactured by Thermion Systems International, Inc.) may be used to heat the atmosphere and/or the platen 119 during the dopant implantation.

In some embodiments, the ion implant 214 may include multiple implantation steps/species. Although non-limiting, the species of the ion implant 214 may include boron, carbon, silicon, germanium, aluminum, and gallium. The disclosure is not limited to these species.

Figure 4:
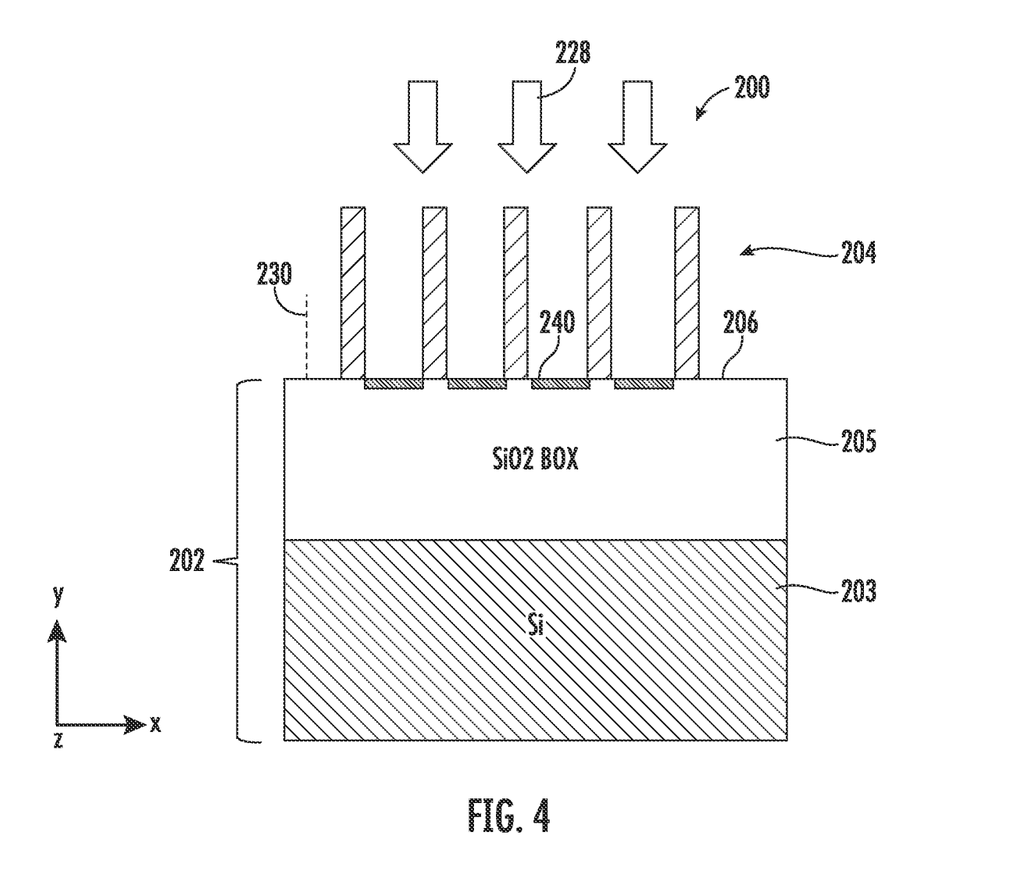
FIG. 4 is a side cross-sectional view of the device following removal of a masking layer according to embodiments of the present disclosure.

Next, as shown in FIG. 4, an etch process 228 may be performed to the device 200 to remove the masking layer 210 from atop the plurality of fins 204. The etch process 228 may be delivered vertically, as shown, or at a non-zero angle of inclination relative to a perpendicular 230 to the top surface 206 of the substrate 202. In exemplary embodiments, the etch process 228 is generally selective to the Si of the plurality of fins 204, without impacting or significantly removing material of the BOX layer 205. As a result, damage to the thermally grown BOX layer 205 is minimized while the masking layer 210 is removed.

Although not shown, processing of the device 200 may then continue following removal of the masking layer 210. For example, a subsequent front-end-of-line (FEOL) process, including fin cut, may be performed.

Figure 5A:
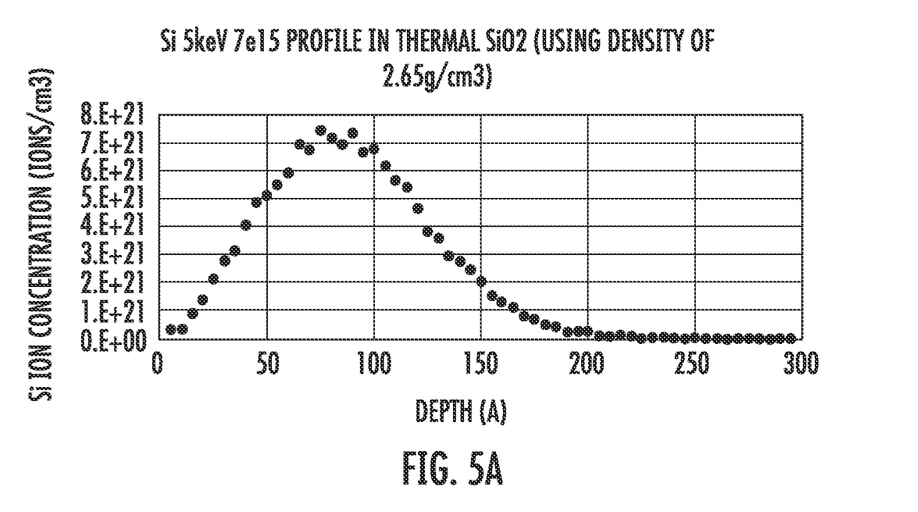
FIGS. 5A-5B are graphs illustrating etch depth for various implantation energies according to embodiments of the present disclosure.
Figure 5B:
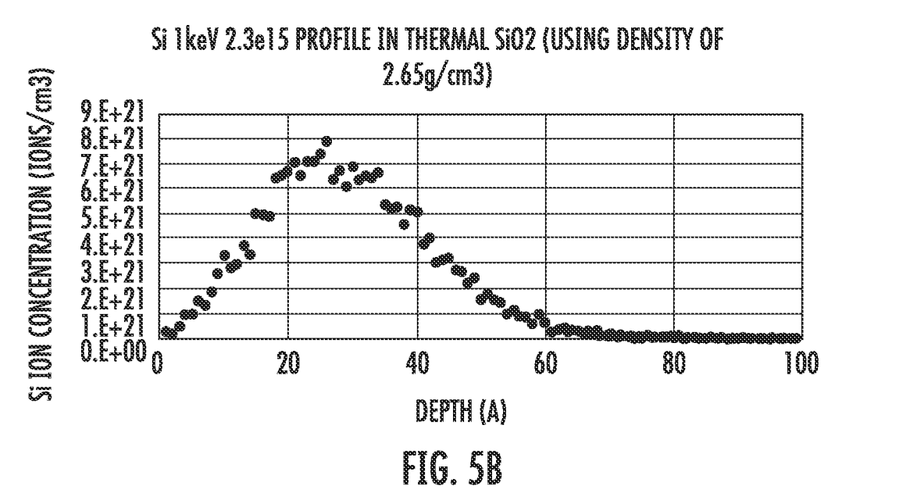

FIGS. 5A-5B demonstrate Si I/I to reduce wet etch rate of $SiO_2$. For the application to reduce erosion of the BOX layer 205, a shallow implant for the ion implant 214 of the order 10 nm may be used. As shown in the simulation of FIG. 5A, for a 5 keV implant, a dose of 7e15 ions/cm2 may be needed to achieve 7e21 ions/cm3. In some embodiments, even shallower implants may be beneficial to avoid near surface divot creation, i.e., energy in the range 0.2 keV to 5 keV. Shallow implants may enable higher productivity solution due to lower dose required to achieve the same concentration. For example, as shown in the simulation of FIG. 5B, a 1 keV implant @ 2.3e15 ions/cm2 has similar concentration as 5 keV @ 7e15 ions/cm2.

It is to be understood that the various layers, structures, and regions shown in the accompanying drawings are schematic illustrations. For ease of explanation, one or more layers, structures, and regions of a type commonly used to form semiconductor devices or structures may not be explicitly shown in a given drawing. This does not imply that any layers, structures, and/or regions not explicitly shown are omitted from the actual semiconductor structures.

In various embodiments, design tools can be provided and configured to create the datasets used to pattern the semiconductor layers of the device 200, e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading the Detailed Description, the various features and functionality described herein may be implemented in any given application and can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method, comprising:
   providing a semiconductor device within a process chamber, the semiconductor device comprising:
   a plurality of fins extending from a buried oxide layer; and
   a masking layer atop each of the plurality of fins;
   performing a high-temperature ion implant to an exposed top surface of the buried oxide layer; and
   performing an etch process to remove the masking layer from atop each of the plurality of fins, without removing the buried oxide layer.

2. The method of claim 1, further comprising providing the buried oxide layer atop a silicon substrate layer.

3. The method of claim 1, further comprising performing the high-temperature ion implant at a temperature greater than 150° C.

4. The method of claim 1, further comprising performing the high-temperature ion implant at a temperature between 150° C. and 550° C.

5. The method of claim 1, wherein the buried oxide layer is thermally grown.

6. The method of claim 1, wherein the high-temperature ion implant is delivered perpendicularly to the exposed top surface of the buried oxide layer.

7. The method of claim 1, wherein the high-temperature ion implant is a silicon ion implant.

8. The method of claim 1, wherein the masking layer is a silicon nitride hardmask.

9. A masking layer removal process, comprising:
   providing a semiconductor device, comprising:
   a plurality of fins extending vertically from a thermally grown oxide layer; and
   a masking layer atop each of the plurality of fins;
   performing a high-temperature ion implant to an exposed top surface of the thermally grown oxide layer; and
   performing an etch process to remove the masking layer from atop each of the plurality of fins, wherein the etch process does not remove the thermally grown oxide layer.

10. The masking layer removal process of claim 9, further comprising providing the thermally grown oxide layer atop a silicon substrate layer.

11. The masking layer removal process of claim 9, further comprising performing the high-temperature ion implant at a temperature greater than 150° C.

12. The masking layer removal process of claim 9, further comprising performing the high-temperature ion implant at a temperature between 150° C. and 550° C.

13. The masking layer removal process of claim 9, wherein the thermally grown oxide layer is a buried oxide layer.

14. The masking layer removal process of claim 9, wherein the high-temperature ion implant is delivered perpendicularly to the exposed top surface of the thermally grown oxide layer.

15. The masking layer removal process of claim 9, wherein the high-temperature ion implant is a silicon ion implant.

16. The masking layer removal process of claim 9, wherein the masking layer is a silicon nitride hardmask.

17. A method of forming a semiconductor device, comprising:
    forming a plurality of fins extending from a buried oxide layer, wherein a masking layer is disposed atop each of the plurality of fins;
    performing a high-temperature ion implant to an exposed top surface of the buried oxide layer; and
    performing an etch process to remove the masking layer from atop each of the plurality of fins, wherein the etch process does not remove the buried oxide layer.

18. The method of claim 17, wherein the etch process is selective to silicon of the plurality of fins.

19. The method of claim 17, wherein the high-temperature ion implant is delivered vertically to the buried oxide layer.

* * * * *